(12) United States Patent
Wedi et al.

(10) Patent No.: US 10,600,658 B2
(45) Date of Patent: Mar. 24, 2020

(54) APPARATUS AND METHOD FOR BENDING A SUBSTRATE

(71) Applicant: Infineon Technologies AG, Neubiberg (DE)

(72) Inventors: Andre Wedi, Soest (DE); Guido Boenig, Warstein (DE); Niels Oeschler, Moehnesee (DE); Christian Stahlhut, Rinteln (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/588,447

(22) Filed: Sep. 30, 2019

(65) Prior Publication Data

US 2020/0027752 A1    Jan. 23, 2020

Related U.S. Application Data (63) Continuation of application No. 16/021,619, filed on Jun. 28, 2018, now Pat. No. 10,475,668.

(30) Foreign Application Priority Data

Jun. 29, 2017    (EP) .................... 17178590

(51) Int. Cl.
| | | |
|---|---|---|
| H01L 21/48 | (2006.01) | |
| H01L 23/373 | (2006.01) | |
| H01L 23/492 | (2006.01) | |
| H01L 23/00 | (2006.01) | |

(52) U.S. Cl.
CPC ...... *H01L 21/4878* (2013.01); *H01L 23/3735* (2013.01); *H01L 23/492* (2013.01); *H01L 24/75* (2013.01); *H01L 2224/79315* (2013.01); *H01L 2924/3511* (2013.01)

(58) Field of Classification Search
None
See application file for complete search history.

(56) References Cited

U.S. PATENT DOCUMENTS

| | | | |
|---|---|---|---|
| 5,379,942 A | 1/1995 | Kuhnert et al. | |
| 9,312,237 B2 * | 4/2016 | Zheng | H01L 23/49816 |
| 2011/0057284 A1 | 3/2011 | Brodie | |
| 2014/0080247 A1 * | 3/2014 | Kadono | H01L 21/02381 |
| | | | 438/73 |
| 2016/0086994 A1 * | 3/2016 | Guenter | H04N 5/3696 |
| | | | 250/206 |
| 2016/0254209 A1 | 9/2016 | Oohiraki et al. | |
| 2016/0286102 A1 * | 9/2016 | Sulfridge | H04N 5/2253 |
| 2016/0293429 A1 * | 10/2016 | Keefe | H01L 21/304 |
| 2018/0076257 A1 | 3/2018 | McKnight et al. | |

* cited by examiner

*Primary Examiner* — Bradley Smith
(74) *Attorney, Agent, or Firm* — Murphy, Bilak & Homiller, PLLC (57) ABSTRACT

A method includes placing a substrate on a first curved surface of a first bending tool, using a second bending tool with a second surface to apply pressure to the substrate, thereby pressing the substrate onto the first curved surface and bending the substrate, and removing the bended substrate from the first bending tool.

20 Claims, 4 Drawing Sheets

APPARATUS AND METHOD FOR BENDING A SUBSTRATE

TECHNICAL FIELD

The instant disclosure relates to an apparatus and a method for processing a semiconductor substrate, in particular a semiconductor substrate for a power semiconductor module arrangement.

BACKGROUND

Power semiconductor module arrangements often include a base plate within a housing. At least one substrate is arranged on the base plate. A semiconductor arrangement including a plurality of controllable semiconductor elements (e.g., two IGBTs in a half-bridge configuration) is arranged on each of the at least one substrate. Each substrate usually comprises a substrate layer (e.g., a ceramic layer), a first metallization layer deposited on a first side of the substrate layer and a second metallization layer deposited on a second side of the substrate layer. The controllable semiconductor elements are mounted, for example, on the first metallization layer. The second metallization layer is usually attached to the base plate. When mounting the controllable semiconductor devices to the substrate, e.g., by soldering or sintering, the semiconductor devices are usually pressed onto the first metallization layer with a certain amount of force and under the influence of high temperatures, wherein the temperatures usually lie at about 300° C., sometimes even 500° C. and more. This leads to a deformation of the substrate, usually a convex deflection in the direction of the first metallization layer on which the semiconductor elements are mounted.

Base plates are usually manufactured to have a concave deflection in the direction of the surface on which the one or more substrates are to be mounted. The deflection of the base plate, therefore, is opposite to the deflection of the substrate. When mounting the substrate to the base plate, a connection layer is arranged between the base plate and the substrate. Such a connection layer usually completely fills the space between the base plate and the substrate and therefore has a non-uniform thickness because of the opposite deflections of the substrate and the base plate. The thickness of the connection layer influences the heat conduction as well as other parameters. The grade of deformation of the substrate as well as of the base plate may vary between different substrates and base plates and is usually not predictable, which may lead to unpredictable thicknesses of the connection layer and to an unpredictable thermal conduction. This may limit the reliability of the semiconductor arrangement and the whole power semiconductor module arrangement.

There is a need for a semiconductor substrate that avoids the drawbacks mentioned above as well as others and which allows to produce power semiconductor module arrangements with an increased reliability, and for an apparatus and a method for producing such a semiconductor substrate.

SUMMARY

A method includes placing a semiconductor substrate on a first curved surface of a first bending tool, using a second bending tool with a second surface to apply pressure to the semiconductor substrate, thereby pressing the semiconductor substrate onto the first curved surface and bending the semiconductor substrate, and removing the bended semiconductor substrate from the first bending tool.

An apparatus includes a first bending tool with a first curved surface and a second bending tool with a second surface. The second bending tool is configured to apply pressure to a semiconductor substrate that is arranged on the first curved surface, thereby pressing the semiconductor substrate onto the first curved surface and bending the semiconductor substrate.

Those skilled in the art will recognize additional features and advantages upon reading the following detailed description, and upon viewing the accompanying drawings.

BRIEF DESCRIPTION OF THE DRAWINGS

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body as described herein may be made from (doped) semiconductor material and may be a semiconductor chip or be included in a semiconductor chip. A semiconductor body has electrically connecting pads and includes at least one semiconductor element with electrodes.

Figure 1:
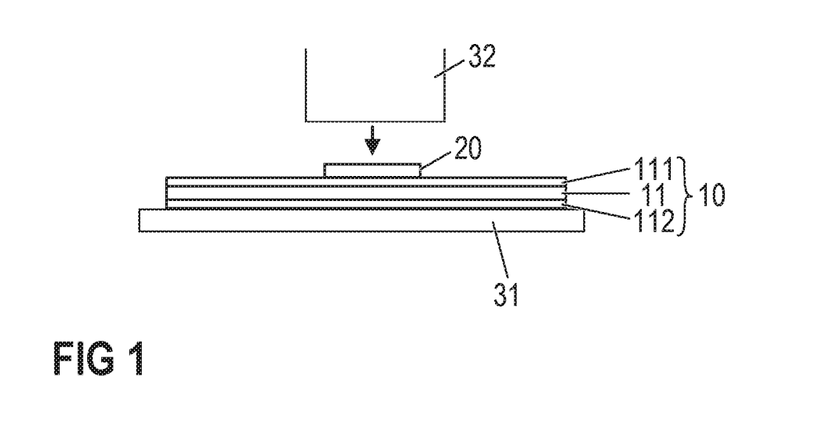
FIG. 1 is a cross-sectional view of an arrangement for mounting semiconductor bodies onto a semiconductor substrate.

Referring to FIG. 1, a semiconductor substrate 10 is illustrated. The semiconductor substrate 10 includes a dielectric insulation layer 11, a (structured) first metallization layer 111 attached to the dielectric insulation layer 11, and a second (structured) metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminium; an aluminium alloy; any other metal or alloy that remains solid during the operation of the power semiconductor module arrangement. The semiconductor substrate 10 may be a ceramic substrate, that is, a substrate in which the dielectric insulation layer 11 is a ceramic, e.g., a thin ceramic layer. The ceramic may consist of or include one of the following materials: aluminium oxide; aluminium nitride; zirconium oxide; silicon nitride; boron nitride; or any other dielectric ceramic. For example, the dielectric insulation layer 11 may consist of or include one of the following materials: $Al_2O_3$, AlN, or $Si_3N_4$. For instance, the substrate 10 may, e.g., be a Direct Copper Bonding (DCB) substrate, a Direct Aluminium Bonding (DAB) substrate, or an Active Metal Brazing (AMB) substrate. The substrate 10 may also be a conventional printed circuit board (PCB) having a non-ceramic dielectric insulation layer 11. For instance, a non-ceramic dielectric insulation layer 11 may consist of or include a cured resin.

One or more semiconductor bodies 20 may be arranged on the semiconductor substrate 10. Each of the semiconductor bodies 20 arranged on the semiconductor substrate 10 may include an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable controllable semiconductor element.

The one or more semiconductor bodies 20 may form a semiconductor arrangement on the semiconductor substrate 10. In FIG. 1, only one semiconductor body 20 is exemplarily illustrated. The first metallization layer 111 of FIG. 1 is a continuous layer. The first metallization layer 111, however, may be structured, for example if more than one semiconductor body 20 is mounted to the semiconductor substrate 10. "Structured metallization layer" means that the first metallization layer 111 is not a continuous layer, but includes recesses between different sections of the layer. Such recesses are schematically illustrated, for example, in FIG. 6C, where the first metallization layer 111 includes three different sections. Different semiconductor bodies 20 may be mounted to the same or to different sections of the first metallization layer 111. Different sections of the first metallization layer may have no electrical connection or may be electrically connected to one or more other sections using, e.g., bonding wires 21. An electrical connection (bonding wire 21) which electrically connects the semiconductor body on one section of the first metallization layer 111 with another section of the first metallization layer 111 is schematically illustrated in FIG. 6C in a dashed line. The one or more semiconductor bodies 20 may be electrically and mechanically connected to the semiconductor substrate 10 by an electrically conductive connection layer (not illustrated in FIG. 1). Such an electrically conductive connection layer may be a solder layer, a layer of an electrically conductive adhesive, or a layer of a sintered metal powder, e.g., a sintered silver powder, for example.

When mounting the one or more semiconductor bodies 20 to the substrate 10, the substrate is usually placed on a contact surface of a first mounting tool 31. The semiconductor bodies 20 are arranged on the substrate surface (top surface) and are then pressed onto the substrate 10 using a second mounting tool 32. Appropriate methods for mounting a semiconductor body 20 to a semiconductor substrate 10 such as, e.g., soldering methods or sintering methods, are commonly known and will not be described in further detail. The substrate 10, the semiconductor bodies 20 as well as a contact layer (not illustrated) between the substrate 10 and the semiconductor bodies 20 are usually heated during such mounting process, e.g., a sintering process. The temperature during the mounting of the semiconductor bodies 20 may be more than 200° C., more than 300° C., or more than 400° C., for example.

When the first metallization layer 111 and the second metallization layer 112 are exposed to pressure and/or heat, the layers are deformed. The deformation of the first metallization layer 111, however, may be different from the deformation of the second metallization layer 112. After the subsequent cooling of the semiconductor substrate 10, this further leads to a deformation of the dielectric insulation layer 11 that is stacked between the first metallization layer 111 and the second metallization layer 112. Thus, the substrate 10 with the semiconductor bodies 20 mounted thereon is permanently bended and usually has a convex deflection in the direction of the first metallization layer 111 on which the semiconductor bodies 20 are mounted. This convex deflection or curvature is exemplarily illustrated in FIG. 2A. The dashed lines in FIG. 2A merely serve to illustrate the deflections of the different elements illustrated therein. The deflection of the semiconductor substrate 10 or, in other words, the deviation from its original (essentially plane) form, may be, e.g., between about 100 μm and about 500 μm (difference in height between the edges and the center of the semiconductor substrate).

Figure 2A:
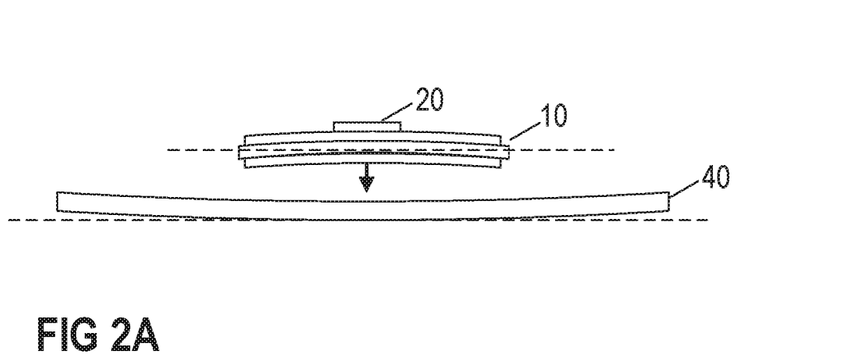
FIGS. 2A and 2B illustrate cross-sectional views of a semiconductor substrate before and after mounting the semiconductor substrate onto a base plate.
Figure 2B:
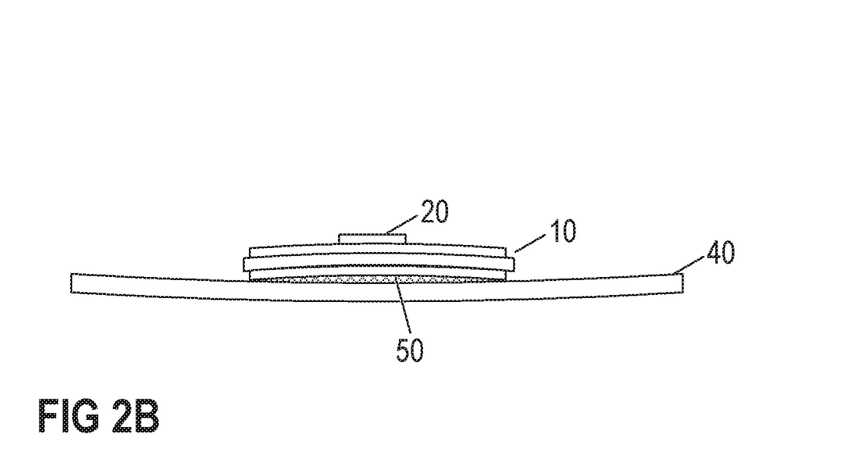

In a power semiconductor module, one or more semiconductor substrates 10 are usually arranged on a base plate 40. The base plate 40 may have a thickness of between about 1 mm and about 6 mm, for example. The base plate 40, however, may also be thinner than 1 mm or thicker than 6 mm. The base plate 40 may consist of or include a metal or a metal matrix composite material (e.g., metal matrix composite MMC such as aluminium silicon carbide), for example. Suitable materials for a metal base plate 40 are, for example, copper, a copper alloy, aluminium, or an aluminium alloy. The base plate 40 may be coated by a thin coating layer (not illustrated). Such a coating layer may consist of or include nickel, silver, gold, or palladium, for example. The coating layer is optional and may improve the solderability of the base plate 40. The base plate 40 may be arranged in a housing (not illustrated). The at least one substrate 10 may be electrically and mechanically connected to the base plate 40 by a first connection layer 50. The first connection layer 50 may be a solder layer, a layer of an electrically conductive adhesive, or a layer of a sintered metal powder, e.g., a sintered silver powder, for example. A semiconductor module 10 that is mounted on a base plate 40 is exemplarily illustrated in FIG. 2B. The base plate 40 usually has a deflection. The deflection of the base plate 40 is generally opposite to the deflection of the semiconductor substrate 10. For example, if the semiconductor substrate 10 has a convex deflection as has been described above, the base plate 40 has a concave deflection in the direction of the surface on which the one or more base plates 40 are mounted, as is illustrated in FIGS. 2A and 2B. The deflection of the base plate 40 or, in other words, the deviation from its original (essentially plane) form, may be in the same order as the deflection of the semiconductor substrate, namely between about 100 μm and about 500 μm, for example (difference in height between the edges and the center of the base plate).

The examples illustrated herein describe a semiconductor substrate 10 that is mounted on a base plate 40. This is, however only an example. In some power semiconductor module arrangements, the semiconductor substrate 10 is not mounted to a base plate 40. Instead of to a base plate 40, the semiconductor substrate 10 may be mounted to a heat sink (not illustrated), for example. A layer of heat-conducting paste may be arranged between the semiconductor substrate 10 and the heat sink, for example. Mounting the semiconductor substrate 10 to a base plate 40 or a heat sink are, however, only examples. Generally, the semiconductor substrate 10 may be mounted to any suitable device or entity of a power semiconductor module arrangement.

Figure 3:
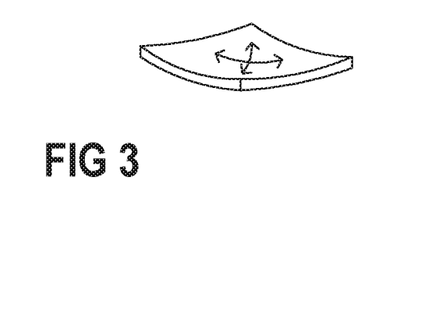
FIG. 3 schematically illustrates a curved semiconductor substrate.

The semiconductor substrate 10 may be deflected in one direction in space only. However, as is schematically illustrated in FIG. 3, the semiconductor substrate 10 may also be deflected in two directions in space, resulting in a cushion-shape or shell-like shape of the substrate 10. The same applies for the base plate 40.

As can be seen from the arrangement illustrated in FIG. 2B, the first connection layer 50 may have a varying thickness. The thickness of the first connection layer 50 may be greater below the center of the semiconductor substrate 10 and may be smaller near the edges of the semiconductor substrate 10. In areas where the first connection layer 50 has a great thickness, the thermal resistance may be poor. The thinner the first connection layer 50, the lower the thermal resistance and the better the power density. The thickness of the first connection layer 50 may vary greatly for different power semiconductor modules. This is because the deflection of the semiconductor substrate 10 and of the base plate 40 currently cannot be reliably manipulated and may vary greatly between different substrates and base plates. A homogenous first connection layer 50, however, usually provides a better thermal resistance for the power semiconductor module which may lead to an increased reliability of the power semiconductor module.

Figure 4:
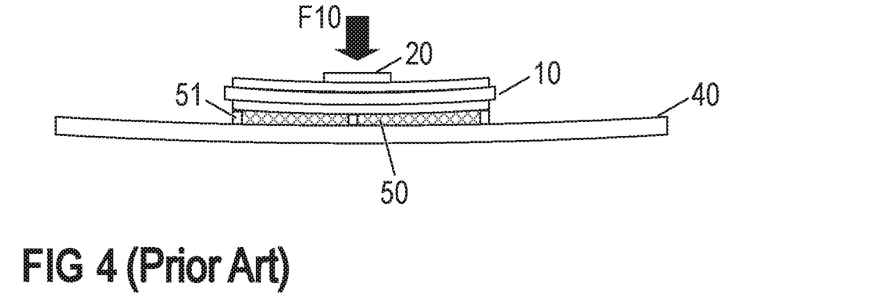
FIG. 4 schematically illustrates a semiconductor substrate that is mounted onto a base plate with an essentially homogenous connection layer.

Different methods are currently known for generating a homogenous first connection layer 50 between the semiconductor substrate 10 and the base plate 40 (or heat sink etc.). One method includes the positioning of spacers 51 between the semiconductor substrate 10 and the base plate 40, as is schematically illustrated in FIG. 4. When mounting the semiconductor substrate 10 to the base plate 40, the semiconductor substrate 10 is pressed onto the base plate 40 or, more particularly, onto the one or more spacers 51 with great force F10. For example, one or more weights may be placed on top of the semiconductor substrate 10 to bend the semiconductor substrate 10 in the direction of the base plate 40 until it reaches the spacers 51. After the bending the semiconductor substrate may have essentially the same deflection as the base plate 40. The weights may be in the range of several 100 g, for example, and may apply a very selective force to only some areas of the semiconductor substrate 10. The force, therefore, is not evenly distributed over the surface of the semiconductor substrate 10. Placing rather heavy weights on the semiconductor substrate 10, thereby bending the semiconductor substrate 10 in the direction of the base plate 40, leads to an essentially homogenous first connection layer 50. However, the semiconductor substrate 10 and the semiconductor bodies 20 mounted thereon are subjected to a great, selective force F10 and may be severely damaged during the mounting process. Furthermore, the heavy weights usually need to be handled manually, which may lead to physical harm of the operating personnel when many weights need to be handled. Another drawback lies in the fact that placing heavy weights (e.g., >100 g) on the semiconductor substrate 10 alters the thermal capacity of the soldering forms that are used for mounting the semiconductor substrates 10 to the base plates 40 during a soldering process.

The present invention tries to avoid the exertion of a great force when mounting the semiconductor substrate 10 onto the base plate 40, thereby reducing the risk of damages of the semiconductor substrate 10 and the semiconductor bodies 20 mounted thereon. Further, the deflection of the semiconductor substrates 10 may be more reliably adjusted such that it varies less between different semiconductor substrates 10.

Figure 5A:
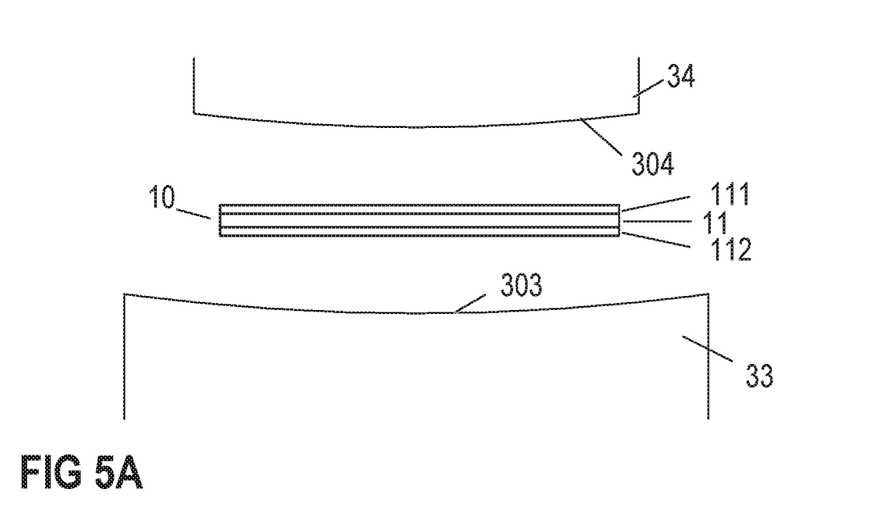
FIGS. 5A to 5D schematically illustrate an example of a method for processing a semiconductor substrate and an apparatus for processing a semiconductor substrate.

As is schematically illustrated in FIG. 5A, an apparatus for processing a semiconductor substrate 10 includes a first bending tool 33 and a second bending tool 34. The first bending tool 33 comprises a first curved surface 303, e.g., a curved top surface. The second bending tool 34 comprises a second curved surface 304, e.g., a bottom surface. The first curved surface 303 may be a concave surface or a convex surface, for example. The deflection of the second curved surface 304 may be opposite to the deflection of the first curved surface 303. For example, the second curved surface 304 may be a convex surface if the first curved surface is a concave surface, and vice versa. A semiconductor substrate 10 may be arranged between the first bending tool 33 and the second bending tool 34. For example, the semiconductor substrate 10 may be placed on the first curved surface 303. According to one example, the second metallization layer 112 that is to be mounted to the base plate 40, faces the first curved surface 303 and the first metallization layer 111 on which the one or more semiconductor bodies are to be mounted faces the second curved surface 304.

The first curved surface 303 may be curved in only one direction of space to generate a deflection of the semiconductor substrate 10 in only one direction. However, it is also possible that the first curved surface 303 is curved in two directions of space, e.g., pillow-shaped or shell-like shape, to generate a deflection of the semiconductor substrate 10 in two directions as has been described with reference to FIG. 3 before. The same applies for the second curved surface 304.

Figure 5B:
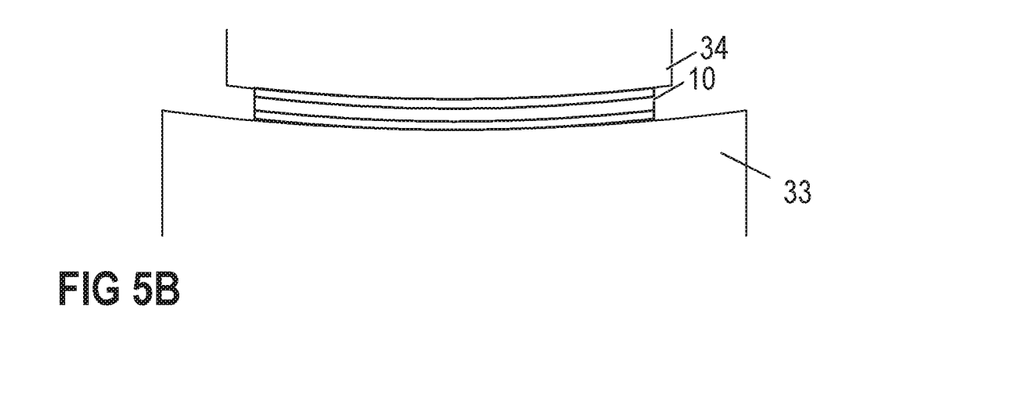

After placing the semiconductor substrate 10 on the first bending tool 33, the second bending tool 34 may apply pressure (a force) to the semiconductor substrate 10, as is schematically illustrated in FIG. 5B. By applying a force to the semiconductor substrate 10, the semiconductor substrate 10 adapts to the shape of the first and the second bending tool 33, 34. While applying a force to the semiconductor substrate 10, the semiconductor substrate 10 may additionally be heated. For example, the semiconductor substrate 10 may be heated to up to 200° C., to up to 300° C., to up to 400° C., or to up to 500° C. Heating the semiconductor substrate 10, however, is optional. The process may also be performed at room temperature, for example.

The deflection of the first bending tool 33 and the second bending tool 34 may be in the same dimension as the desired deflection of the semiconductor substrate 10, for example. For example, the first bending tool 33 may have a deflection of, e.g., between about 100 μm and about 500 μm (difference in height between the edges/corners and the center of the first curved surface 303). The second bending tool 34 may also have a deflection of, e.g., between about 100 μm and about 500 μm. The deflection of the first bending tool 33 may be in the same order as the deflection of the second bending tool 34, with the only difference that the orientation of the deflection is opposite to the orientation of the deflection of the first bending tool 33 (e.g., first bending tool 33 concave, second bending tool 34 convex, or vice versa). In this way, an essentially homogenous first connection layer 50 may be obtained during a following soldering process during which the semiconductor substrate 10 is mounted to the base plate 40. Essentially homogenous in this context means that the thickness of the first connection layer 50 has a deviation of, e.g., maximally ±25 µm, maximally ±50 µm, or maximally ±75 µm of the average thickness over the entire area. According to another example, the thickness of the first connection layer 50 has a deviation of, e.g., maximally ±13 µm of the average thickness over the entire area. Other greater or smaller deviations are also possible. The deflection of the semiconductor substrate 10, however, may also differ from the deflection of the base plate 40, e.g., be greater or smaller than the deflection of the base plate 40. In this way, a first connection layer 50 may be obtained which has a greater thickness at the center of the semiconductor substrate 10 and a smaller thickness near the edges/corners of the semiconductor substrate 10. Or a first connection layer 50 may be obtained which has a smaller thickness at the center of the semiconductor substrate 10 and a greater thickness near the edges/corners of the semiconductor substrate 10. For example, the thickness of the first connection layer 50 near the edges/corners (below the edges/corners) of the semiconductor substrate 10 may be 50 µm or more than 50 µm thinner than the thickness at the center (below the center) of the semiconductor substrate 10. Generally, typical average thicknesses of the first connection layer 50 may be between about 200 µm and about 600 µm. For some materials such as AlSiC, for example, a typical average thickness of down to about 50 µm is also possible.

The thickness of the first connection layer 50 may be reliably adjusted by pre-bending the semiconductor substrate 10. By reliably adjusting the thickness of the first connection layer 50, the reliability of the semiconductor arrangement arranged on the semiconductor substrate 10 as well as the reliability of the whole power semiconductor module arrangement may be increased.

In the figures, the second bending tool 34 has a surface area which is greater than the surface area of the semiconductor substrate 10. This means that during the bending process, while the second bending tool 34 applies a pressure to the semiconductor substrate 10, the second bending tool 34 completely covers the semiconductor substrate 10. This is, however, only an example. The second bending tool 34 may have a surface area which is smaller than the surface area of the semiconductor substrate 10. This means that during the bending process, while the second bending tool 34 applies a pressure to the semiconductor substrate 10, the second bending tool 34 does not completely cover the semiconductor substrate 10. In this example, the second bending tool 34 only partly covers the semiconductor substrate 10. For example, the second bending tool 34 may apply a pressure only on a central part of the semiconductor substrate 10, while no pressure is applied near the edges of the semiconductor substrate 10.

Further, the second bending tool 34 that is illustrated in the figures has a continuous surface. This is, however, only an example. The second bending tool 34 may also include several parts (so-called multi-stamp tool). For example, a first part may apply a pressure to a central region of the semiconductor substrate 10, a second part may apply a pressure to an edge region of the semiconductor substrate 10, and a third part may apply a pressure to a region in between the central region and the edge region. There may be areas of the semiconductor substrate 10, to which no pressure is applied directly. In other words, pressure may be applied selectively to different areas of the semiconductor substrate 10. Using such a multi-stamp tool or a second bending tool 34 with a surface area that is smaller than the surface area of the semiconductor substrate 10, it is still possible to push the semiconductor substrate 10 onto the first bending tool 33 such that it adapts to the shape of the first bending tool 33.

Figure 5C:
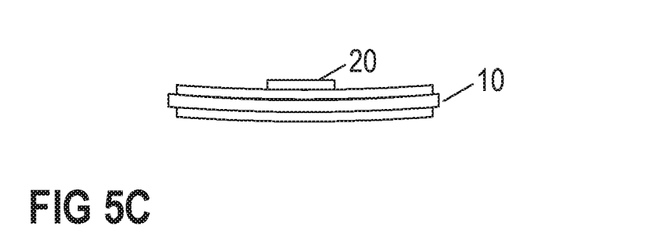
Figure 5D:
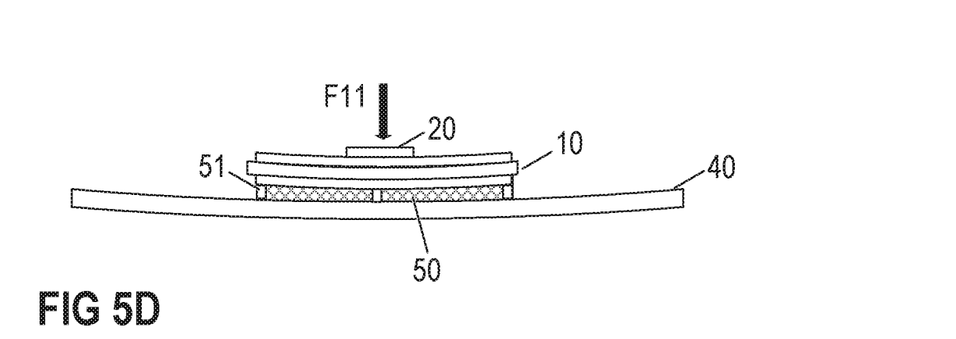

When the second bending tool 34 is subsequently lifted from the semiconductor substrate 10 and the semiconductor substrate 10 is removed from the first bending tool 33, the semiconductor substrate 10 is (permanently) bended (curved). A bended semiconductor substrate 10 is exemplarily illustrated in FIG. 5C. In a following step, one or more semiconductor bodies 20 may be mounted to the bended semiconductor substrate 10. The semiconductor bodies 20 may be soldered onto the semiconductor substrate 10, for example. Soldering processes for mounting semiconductor bodies 20 on a semiconductor substrate 10 are generally known and will not be described in further detail.

Once the semiconductor bodies 20 are mounted to the semiconductor substrate 10, the semiconductor substrate 10 may be mounted to a base plate 40. As has been described above, one or more spacers 51 may be arranged between the base plate 40 and the semiconductor substrate 10. The one or more spacers 51 form an end stop for the semiconductor substrate 10 during a soldering process. By pressing the semiconductor substrate 10 against the one or more spacers 51 during the soldering process such that the semiconductor substrate 10 abuts the spacers 51, a homogenous first connection layer 50 between the semiconductor substrate 10 and the base plate 40 may be obtained. The height as well as the number of spacers 51 defines the thickness of the first connection layer 50. The spacers 51 may be separate elements that are mounted to the base plate 40 by any appropriate means. According to another example, the spacers 51 are integral parts of the base plate 40, e.g., protrusions or projections. Such spacers 51, however, are optional.

Generally, after pre-bending the semiconductor substrate with the first bending tool 33 and the second bending tool 34, the deflection of the semiconductor substrate 10 may essentially correspond to the deflection of the base plate 40. As the deflection of the semiconductor substrate 10 essentially corresponds to the deflection of the base plate 40, it is no longer necessary to apply a great force to the semiconductor substrate 10, as has been described with reference to FIG. 4 before. It is no longer necessary to further bend the semiconductor substrate 10 during the step of mounting the semiconductor substrate 10 to the base plate 40, because the semiconductor substrate 10 is already pre-bended to have a concave deflection. The deflection of the semiconductor substrate 10 essentially corresponds to the deflection of the base plate 40 and, therefore, a comparatively small force F11 is necessary to press the semiconductor substrate 10 to the base plate 40. In order to apply a force F11 to the semiconductor substrate 10, small weights may be placed on top of the semiconductor substrate 10, to press the semiconductor substrate 10 onto the base plate 40. The small weights that are placed on the semiconductor substrate 10 may be in the range of 10 g or up to several 10 g, for example. The weights that are placed on the semiconductor substrate 10 are only needed to fixate the semiconductor substrate 10 in place to keep the desired orientation of the semiconductor substrate 10.

Figure 6A:
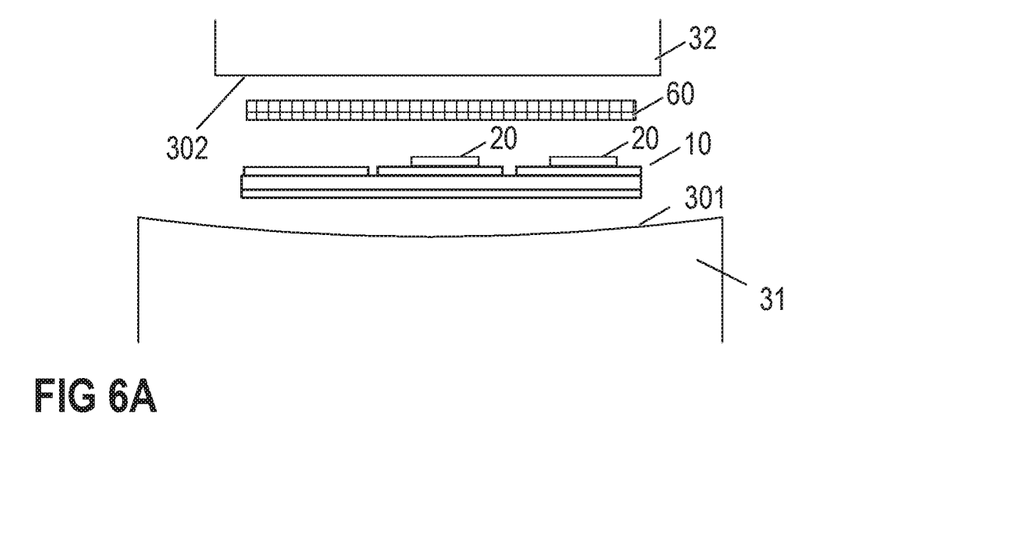
FIGS. 6A to 6C schematically illustrate a further example of a method for processing a semiconductor substrate.
Figure 6B:
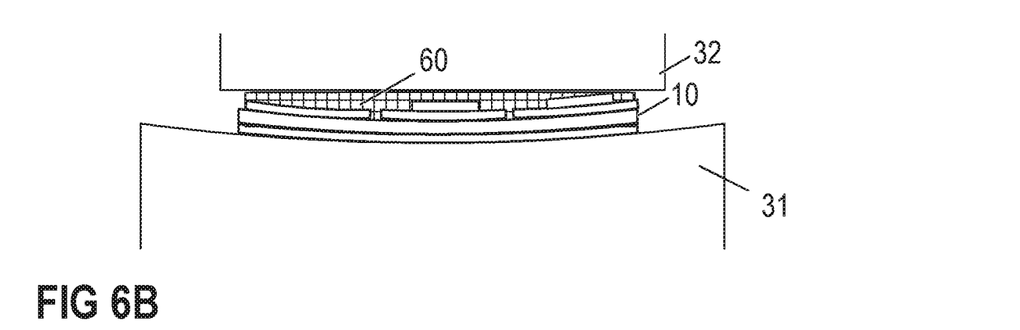
Figure 6C:
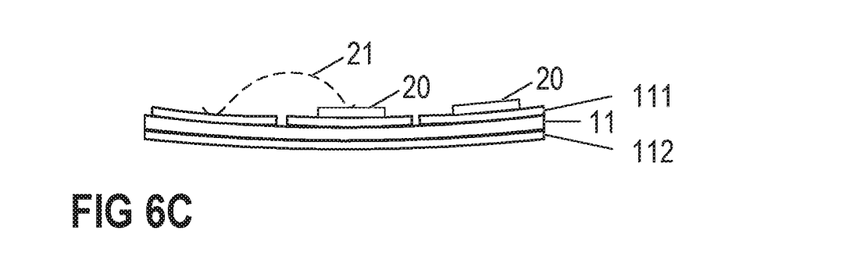

FIGS. 6A through 6C schematically illustrate another method for processing a semiconductor substrate 10. When the semiconductor bodies 20 are, e.g., sintered to the semiconductor substrate 10 instead of soldered, it is possible to mount the semiconductor bodies 20 to the semiconductor substrate 10 while bending the semiconductor substrate 10. The semiconductor substrate 10 may be placed on the first curved surface 303 of the first bending tool 33. Further, one or more semiconductor bodies 20 may be arranged between the semiconductor substrate 10 and the second bending tool 34. A layer of a metal powder, e.g., a silver powder, (not illustrated in FIGS. 6A through 6C) may be arranged between the semiconductor bodies 20 and the semiconductor substrate 10, for example. The second bending tool 34 may have a second curved surface 304, as has been described with respect to FIGS. 5A through 5D before. It is, however, also possible that the second bending tool 34 has a flat, or plane surface, as is schematically illustrated in FIGS. 6A through 6C. A layer of compensatory material 60 may be arranged between the semiconductor substrate 10 with the semiconductor bodies 20 and the second (curved or plane) surface 304. The layer of compensatory material 60 may be configured to distribute the force that is applied by the second bending tool 34 evenly over the semiconductor substrate 10 and the semiconductor bodies 20 arranged thereon. The layer of compensatory material 60 may consist of or comprise any material that is suitable to adjust any differences between the contours of the second (curved) surface 304 and the semiconductor substrate 10, or, more precisely, between the contours of the second (curved) surface 304 and the semiconductor substrate 10 in its desired form (its bended form).

A layer of compensatory material 60 may generally also be used for the method that is described referring to FIGS. 5A through 5D above. Even if no semiconductor bodies are (yet) arranged on the semiconductor substrate 10, the layer of compensatory material 60 may distribute the pressure that is applied by the second bending tool 34 evenly over the semiconductor substrate 10. The layer of compensatory material 60 may be attached to the second surface 304, for example. According to another example, the layer of compensatory material 60 is a foil that is inserted between the semiconductor substrate 10 and the second bending tool 34.

A flat (plane) second surface 304, however, is only an example. It is also possible that the second bending tool 34 has a second curved surface 304, as has been described with respect to FIGS. 5A through 5D before. If the second bending tool 34 comprises a second curved surface 304, the layer of compensatory material 60 is optional and may be omitted.

Again referring to FIGS. 6A through 6C, while applying a force (pressure) to the semiconductor substrate 10 to pre-bend the semiconductor substrate 10, the semiconductor bodies 20 may, at the same time, be sintered to the semiconductor substrate 10. The semiconductor substrate 10 may be heated during the sintering and bending process. For example, the semiconductor substrate 10 may be heated to up to 200° C., to up to 300° C., to up to 400° C. or to up to 500° C. Sinter processes are generally known and will not be described in further detail.

Generally speaking, a method for processing (pre-bending) a semiconductor substrate 10 includes the step of arranging the semiconductor substrate 10 on a first curved surface 303 of a first bending tool 33. Pressure may be applied to the semiconductor substrate 10 by using a second bending tool 34 with a second surface 304. The semiconductor substrate 10 is thereby pressed onto the first curved surface 303 and is thereby pre-bended. The second surface 304 may be a flat surface or a curved surface. If semiconductor bodies 20 are to be soldered to the semiconductor substrate 10, a soldering process may follow after pre-bending the semiconductor substrate 10. This means that semiconductor bodies 20 are soldered on the bended semiconductor substrate 10. If semiconductor bodies 20 are to be sintered to the semiconductor substrate 10, a sintering process may be performed while bending the semiconductor substrate 10. A sintering process usually includes applying a certain pressure to the semiconductor bodies 20 and may be performed at the same time while the semiconductor substrate 10 is pre-bended. After bending the semiconductor substrate 10, the semiconductor substrate 10 is removed from the first bending tool 33. The semiconductor substrate 10 does not have a permanent connection to the first bending tool 33 and is not permanently mounted to the first bending tool 33. After removing the semiconductor substrate 10 from the first bending tool 33, the semiconductor substrate 10 may be mounted to (e.g., soldered to) a base plate 40. Power semiconductor module arrangements often include a base plate 40 (with at least one semiconductor substrate 10 mounted thereon) within a housing. The first bending tool 33 and the second bending tool 34 are not components of such a power semiconductor module arrangement.

As used herein, the terms "having", "containing". "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method, comprising:
    placing a substrate on a first curved surface of a first tool;
    arranging a semiconductor body on the substrate;
    using a second tool with a second surface to apply a first pressure to the substrate and to the semiconductor body arranged on the substrate so as to press the semiconductor body onto the substrate and the substrate onto the first curved surface of the first tool, and pre-bend the substrate with the semiconductor body mounted thereon;
    removing the pre-bended substrate with the semiconductor body mounted thereon from the first tool; and
    after removing the pre-bended substrate with the semiconductor body mounted thereon from the first tool, mounting the pre-bended substrate with the semiconductor body mounted thereon to a bended base plate or heat sink.

2. The method of claim 1, wherein the substrate is placed on the first curved surface of the first tool such that a metallization layer of the substrate faces the first curved surface.

3. The method of claim 1, wherein mounting the pre-bended substrate with the semiconductor body mounted thereon to the bended base plate or heat sink comprises applying a second pressure to the pre-bended substrate with the semiconductor body mounted thereon.

4. The method of claim 3, wherein applying the second pressure to the pre-bended substrate with the semiconductor body mounted thereon comprises placing one or more weights on the pre-bended substrate with the semiconductor body mounted thereon.

5. The method of claim 3, wherein the second pressure is lower than the first pressure.

6. The method of claim 1, wherein the semiconductor body is sintered to a first metallization layer of the pre-bended substrate.

7. The method of claim 1, further comprising:
arranging a layer of compensatory material between the substrate with the semiconductor body arranged thereon and the second surface of the second tool, wherein the layer of compensatory material is configured to distribute the first pressure that is applied to the substrate and the semiconductor body arranged thereon by the second tool evenly over the substrate and the semiconductor body.

8. The method of claim 1, wherein the first pressure applied to the substrate and the semiconductor body mounted thereon is performed at room temperature or at a temperature of up to 500° C.

9. The method of claim 1, wherein before mounting the pre-bended substrate with the semiconductor body mounted thereon to the bended base plate or heat sink, a deflection of the pre-bended substrate with the semiconductor body mounted thereon corresponds to a deflection of the bended base plate or heat sink, and wherein a first connection layer disposed between the pre-bended substrate with the semiconductor body mounted thereon and the bended base plate or heat sink has an even thickness.

10. The method of claim 9, wherein the thickness of the first connection layer has a deviation of maximally ±75 μm from an average thickness over its entire area.

11. The method of claim 1, wherein before mounting the pre-bended substrate with the semiconductor body mounted thereon to the bended base plate or heat sink, a deflection of the pre-bended substrate with the semiconductor body mounted thereon differs from a deflection of the bended base plate or heat sink, and wherein a first connection layer disposed between the pre-bended substrate with the semiconductor body mounted thereon and the bended base plate or heat sink has a thickness which is greater below a center of the pre-bended substrate and smaller near edges of the pre-bended substrate.

12. The method of claim 11, wherein the thickness of the first connection layer has a deviation of maximally ±75 μm from an average thickness over its entire area.

13. The method of claim 1, wherein before mounting the pre-bended substrate with the semiconductor body mounted thereon to the bended base plate or heat sink, a deflection of the pre-bended substrate with the semiconductor body mounted thereon differs from a deflection of the bended base plate or heat sink, and wherein a first connection layer disposed between the pre-bended substrate with the semiconductor body mounted thereon and the bended base plate or heat sink has a thickness which is smaller below a center of the pre-bended substrate and greater near edges of the pre-bended substrate.

14. The method of claim 13, wherein the thickness of the first connection layer has a deviation of maximally ±75 μm from an average thickness over its entire area.

15. The method of claim 1, further comprising:
heating the substrate while applying the first pressure to the substrate and to the semiconductor body arranged on the substrate.

16. The method of claim 1, wherein the first curved surface of the first tool has a deflection in a range between about 100 μm and about 500 μm, wherein the second surface of the second tool has a deflection in a range between about 100 μm and about 500 μm, and wherein an orientation of the deflection of the first curved surface of the first tool is opposite to an orientation of the deflection of the second surface of the second tool.

17. The method of claim 1, wherein a surface area of the second surface of the second tool is greater than a surface area of the substrate.

18. The method of claim 1, wherein the second surface of the second tool is a continuous surface.

19. The method of claim 1, further comprising:
applying a layer of compensatory material between the second surface of the second tool and the substrate, the layer of compensatory material distributing the first pressure applied by the second tool evenly over the substrate.

20. The method of claim 19, wherein applying the layer of compensatory material between the second surface of the second tool and the substrate comprises inserting a foil between the substrate and the second surface of the second tool.

* * * * *